(12) United States Patent
Yazaki et al.

(10) Patent No.: US 6,628,189 B2
(45) Date of Patent: Sep. 30, 2003

(54) LAMINATED BALUN TRANSFORMER

(75) Inventors: Hirokazu Yazaki, Shiga-ken (JP); Atsushi Toujo, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/124,371

(22) Filed: Apr. 18, 2002

(65) Prior Publication Data

US 2002/0153988 A1 Oct. 24, 2002

(30) Foreign Application Priority Data

Apr. 19, 2001 (JP) ........................................ 2001-121719
Apr. 3, 2002 (JP) ........................................ 2002-100720

(51) Int. Cl.[7] ............................................... H01F 5/00
(52) U.S. Cl. ........................ 336/200; 336/83; 336/232
(58) Field of Search .......................... 336/65, 83, 107, 336/192, 200, 223, 232; 29/602.1

(56) References Cited

U.S. PATENT DOCUMENTS 5,416,451 A    5/1995  Kaltenecker et al.
6,388,551 B2 *  5/2002  Morikawa ................... 336/200

FOREIGN PATENT DOCUMENTS

| JP | 07-176918 | 7/1995 |
| JP | 08-125446 | 5/1996 |
| JP | 08-191016 | 7/1996 |
| JP | 09-153708 | 6/1997 |
| JP | 9-260146 | * 10/1997 |
| JP | 11-219824 | * 8/1999 |
| JP | 2000-58328 | * 2/2000 |

* cited by examiner

Primary Examiner—Tuyen T. Nguyen
(74) Attorney, Agent, or Firm—Keating & Bennett, LLP

(57) ABSTRACT

A laminated balun transformer includes a third line element and a first line element which are electromagnetically coupled at a coupling portion to define a first coupler. A second line element and a fourth line element are electromagnetically coupled at a coupling portion to define a second coupler. When the length of a $\lambda/4$ line element at a given characteristic impedance is $L(0)$, the length of the coupling portion of the first and third line elements, which are electromagnetically coupled, is $L(0)+\alpha$ and the length of the coupling portion of the second and fourth line elements, which are electromagnetically coupled, is $L(0)-\beta$, where $\alpha$ and $\beta$ satisfy the relationships $\alpha>0$, $\beta>0$, and $\alpha=\beta$ or $\alpha\neq\beta$.

20 Claims, 6 Drawing Sheets

UNBALANCED
SIGNAL S1

BALANCED
SIGNAL S2

LAMINATED BALUN TRANSFORMER

BACKGROUND OF THE INVENTION

1. Field of the Invention

The present invention relates to laminated balun transformers, and more particularly, to a laminated balun transformer preferably for use as a balanced-to-unbalanced converter, a phase transformer, or other suitable component of an integrated circuit in radio communication equipment.

2. Description of the Related Art

A balun transformer is used to convert a balanced signal from a balanced transmission line into an unbalanced signal for an unbalanced transmission line or to convert an unbalanced signal from an unbalanced transmission line into a balanced signal for a balanced transmission line. The term "balun" is an abbreviation of "BALanced-UNbalanced". A balanced transmission line includes a pair of signal lines, through which a signal (balanced signal) is transmitted as a potential difference therebetween. In a balanced transmission line, the two signal lines are equally affected by external noise, thereby canceling out the external noise. Thus, the balanced transmission line is less susceptible to the influence of external noise. In addition, since the internal circuit of an analog IC (integrated circuit) typically includes a differential amplifier, the input/output signal terminals for the analog IC are often balanced terminals that input or output a signal as a potential difference between the two terminals. In contrast, in an unbalanced transmission line, a signal (unbalanced signal) with a potential relative to a ground potential (zero potential) is transmitted through a single signal line. Examples include a coaxial line and a microstrip line on a substrate.

In the past, a laminated balun transformer 1 as shown in FIG. 9 has been provided as a balanced-to-unbalanced converter for a transmission line in a radio frequency circuit. The balun transformer 1 according to the prior art includes dielectric sheets 2a to 2h. On the surface of the dielectric sheet 2b, a lead electrode 3 is provided. On the dielectric sheets 2c, 2d, 2f, and 2g, ¼ wavelength strip lines 4, 5, 8, and 9 are provided, respectively. On the surfaces of dielectric sheets 2a, 2e, and 2h, shielding ground electrodes 12, 13, and 14 are provided, respectively. The strip lines 4 and 9 are electrically connected in series via a relay terminal N, to define an unbalanced transmission line. The strip lines 5 and 8 define balanced transmission lines, respectively. The strip line 5 is arranged so as to oppose the strip line 4 with the dielectric sheet 2c interposed therebetween. Thus, the strip lines 4 and 5 are electromagnetically coupled (line coupling) to define a first coupler. The strip line 9 is arranged so as to oppose the strip line 8 with the dielectric sheet 2f interposed therebetween. Thus, the strip lines 8 and 9 are electromagnetically coupled (line coupling) to define a second coupler. In FIG. 9, reference numeral 18 indicates a via hole.

In the laminated balun transformer 1 according to the prior art, typically, the lengths of the coupling portion of the strip lines 4 and 5 and the coupling portion of the strip lines 8 and 9 are each set to λ/4. However, when the length of the coupling portion of the strip lines 4 and 5 is set to λ/4, it is difficult to set the length of the coupling portion of the strip lines 8 and 9 to λ/4, due to different lengths of lead portions of the strip lines 4, 5, 8, and 9 and the presence of the relay terminal N. This makes it difficult to adjust the phase of a signal.

SUMMARY OF THE INVENTION

In order to overcome the above-described problems, preferred embodiments of the present invention provide a laminated balun transformer that facilitates adjustment of the phase characteristic of a signal.

According to a first preferred embodiment of the present invention, a laminated balun transformer to be mounted on a circuit board having a ground pattern includes a laminate including first and second spiral line elements that define a pair of balanced transmission lines, third and fourth spiral line elements that define an unbalanced transmission line that is electromagnetically coupled with the balanced transmission lines, and a plurality of dielectric layers, wherein the first, second, third, and fourth spiral line elements, and the dielectric layers are laminated together. When the laminated balun transformer is mounted on the circuit board, the distance between the second and fourth line elements, which are electromagnetically coupled, and the ground pattern is greater than the distance between the first and third line elements, which are electromagnetically coupled, and the ground pattern. Where the length of a λ/4 line element at a given characteristic impedance is L(0), a coupling portion at which the first and third line elements are electromagnetically coupled has a length of L(0)+α and a coupling portion at which the second and fourth line elements are electromagnetically coupled has a length of L(0)−β, where α>0 and β>0.

In general, when the length of a λ/4 line element at a given characteristic impedance is L(0), arranging the line element into a spiral shape provides substantially the same effect (so-called "reduction effect") as using a line element that is shorter than the length L(0). Thus, the coupling portion of the second and third line elements is L(0)−β. As the distance from the two line elements, which are electromagnetically coupled (line coupling), to the ground pattern of the circuit board is increased, a conductor path which electrically connects the two line elements and the ground pattern increases, thereby increasing a parasitic inductance generated in the conductor path. Accordingly, the length of the coupling portion of the first and third line elements is preferably greater than the coupling portion of the second and fourth line elements, that is, to L(0)+α. In this manner, setting the length of the coupling portion of the second and fourth line elements to L(0)−β and setting the length of the coupling portion of the first and third line elements to L(0)+α facilitates adjustment of the phase of a balanced signal output from the balanced transmission lines and the phase of an unbalanced signal output from the unbalanced transmission line.

According to a second preferred embodiment of the present invention, a laminated balun transformer having an input impedance lower than the output impedance thereof is provided. The laminated balun transformer includes a laminate including first and second spiral line elements that define a pair of balanced transmission lines, third and fourth spiral line elements that define an unbalanced transmission line that is electromagnetically coupled with the balanced transmission lines, and a plurality of dielectric layers, wherein the first, second, third, and fourth spiral line elements, and the dielectric layers are laminated together. The third line element, which is electromagnetically coupled with the first line element, is connected to an input terminal of the laminated balun transformer, and the second and fourth line elements, which are electromagnetically coupled, are connected to two output terminals, respectively. When the length of a λ/4 line element at a given characteristic impedance is L(0), a coupling portion at which the first and third line elements are electromagnetically coupled has a length of L(0)+α and a coupling portion at which the second and fourth line elements are electromagnetically coupled has a length of L(0)−β, where α>0 and β>0.

To provide a reduced input impedance, the pattern width of the first and third line elements, which is connected to the input terminal, is increased relative to the second and fourth line elements, which are respectively connected to the output terminals, and/or the thickness of the dielectric layers of a ground electrode and the first and third line elements, which are provided in the balun transformer is decreased. With this arrangement, however, the "reduction effect" of the first and third line elements is decreased.

Accordingly, the length of the coupling portion of the first and third line elements, which are connected to the unbalanced terminal (input terminal), is preferably greater than the length of the coupling portion of the second and fourth line elements. Thus, according to preferred embodiments of the present invention, the length of the coupling portion of the first and third line elements is preferably $L(0)+\alpha$, and the length of the coupling portion of the third and fourth line elements is preferably $L(0)-\beta$. This arrangement facilitates adjustment of the phase of a balanced signal output from the balanced transmission lines and the phase of an unbalanced signal output from the unbalanced transmission line. In addition, setting the lengths thereof to $L(0)+\alpha$ and $L(0)-\beta$ greatly improves the design versatility without compromising the design and structure, even where it is structurally difficult to design the length of the coupling portion of the first and third line elements to be equal to the length of the coupling portion of the second and fourth line elements.

Preferably, the number of turns of the first and third line elements, which are electromagnetically coupled, is greater than the number of turns of the second and fourth line elements, which are electromagnetically coupled. With this arrangement, without changing the number of turns of the first and third line elements, varying the number of turns of the second and third line elements adjusts the respective inductance components of the second and fourth line elements. As a result, this arrangement facilitates adjustment of the input impedance of the laminated balun transformer. In addition, this arrangement enables fine adjustment of the phase of a balanced signal output from the balanced transmission lines and the phase of an unbalanced signal output from the unbalanced transmission line.

Other features, elements, characteristics and advantages of the present invention will become more apparent from the following detailed description of preferred embodiments with reference to the drawings thereof.

DETAILED DESCRIPTION OF PREFERRED EMBODIMENTS

Figure 1:
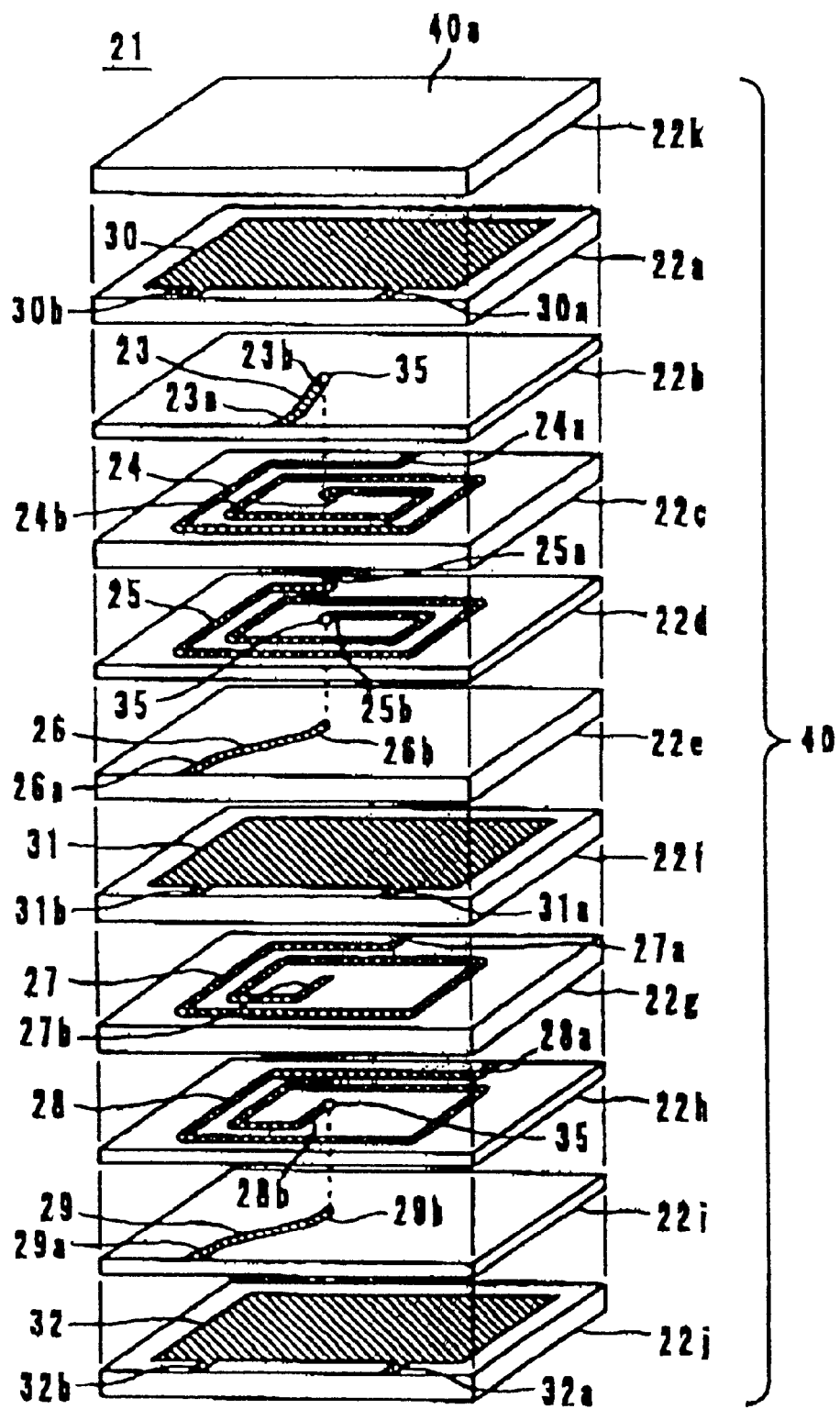
FIG. 1 is an exploded perspective view of a laminated balun transformer according to a first preferred embodiment of the present invention.

Laminated balun transformers according to preferred embodiments of the present invention will be described below with reference to the accompanying drawings. In each preferred embodiment, similar elements and similar portions are denoted with the same reference numerals.

A first preferred embodiment of the present invention will now be described with reference to FIGS. 1 to 5. Referring to FIG. 1, a laminated balun transformer 21 includes dielectric sheets 22a to 22k. On the surfaces of the dielectric sheets 22b, 22e, and 22i, lead electrodes 23, 26, and 29 are provided, respectively. On the surfaces of dielectric sheets 22c, 22d, 22g, and 22h, a third line element 24, a first line element 25, a fourth line element 27, and a second line element 28 are provided, respectively. On the surfaces of the dielectric sheets 22a, 22f, and 22j, ground electrodes 30, 31, and 32 are provided, respectively. The dielectric sheet 22k is a protective sheet and nothing is provided on the surface thereof. The dielectric sheets 22a to 22k may preferably be made of a resin, such as epoxy, or a dielectric ceramic. In the first preferred embodiment, the dielectric sheets 22a to 22k are made of dielectric ceramic powder. The powder is mixed and kneaded with a binder or other suitable material and the resulting mixture is formed into sheets. The thicknesses of the dielectric sheets 22a to 22k are set to desired values.

The lead electrode 23 includes a first end 23a that is exposed at the approximate middle of the proximal edge of the dielectric sheet 22b, and a second end 23b of the lead electrode 23 that is located at the approximate center of the dielectric sheet 22b. The third line element 24 has a spiral shape. The third line element 24 includes a first end 24a that is exposed at the approximate middle of the distal edge of the dielectric sheet 22c, and a second end 24b that is located at the approximate center of the dielectric sheet 22c. The second end 24b of the third line element 24 is electrically connected to the second end 23b of the lead electrode 23 through a via hole 35 provided in the dielectric sheet 22b.

The first line element 25 preferably has a spiral shape. The first line element 25 includes a first end 25a that is exposed at the left side of the distal edge of the dielectric sheet 22d, and a second end 25b that is located at the approximate center of the dielectric sheet 22d. The lead electrode 26 includes a first end 26a exposed at the left side of the proximal edge of the dielectric sheet 22e, and a second end 26b that is located at the approximate center of the dielectric sheet 22e. The second end 26b of the lead electrode 26 is electrically connected to the second end 25b of the first line element 25 through the via hole 35 that is also provided in the dielectric sheet 22d.

The fourth line element 27 has a spiral shape. A first end 27a of the fourth line element 27 is exposed at the approximate middle of the distal edge of the dielectric sheet 22g, and a second end 27b is located at the approximate center of the dielectric sheet 22g. The second line element 28 also preferably has a spiral shape. A first end 28a of the second line element 28 is exposed at the right side of the distal edge of the dielectric sheet 22h, and a second end 28b thereof is located at the approximate center of the dielectric sheet 22h. The lead electrode 29 includes a first end 29a that is exposed at the left side of the proximal edge of the dielectric sheet 22i, and a second end 29b that is located at the approximate center of the dielectric sheet 22i. The second end 29b of the lead electrode 29 is electrically connected to the second end 28b of the second line element 28 through the via hole 35 provided in the dielectric sheet 22h.

The ground electrodes 30, 31, and 32 are provided on substantially an entire surface of the dielectric sheets 22a, 22f, and 22j, respectively. Lead portions 30a, 31a, and 32a of the ground electrodes 30, 31, and 32 are exposed at the right side of the proximal edge of the dielectric sheets 22a, 22f, and 22j, respectively, and lead portions 30b, 31b, and 32b of the ground electrodes 30, 31, and 32 are exposed at the left side of the proximal edge of the dielectric sheets 22a, 22f, and 22j, respectively. The ground electrodes 30, 31, and 32 are preferably arranged to be separated by a desired distance from the line elements 24, 25, 27 and 28. The lead electrodes 23, 26, and 29, the line elements 24, 25, 27, and 28, and the ground electrodes 30, 31, and 32 are preferably formed by sputtering, deposition, printing, or other suitable method, and include Ag—Pd, Ag, Pd, Cu, or other suitable material.

Figure 2:
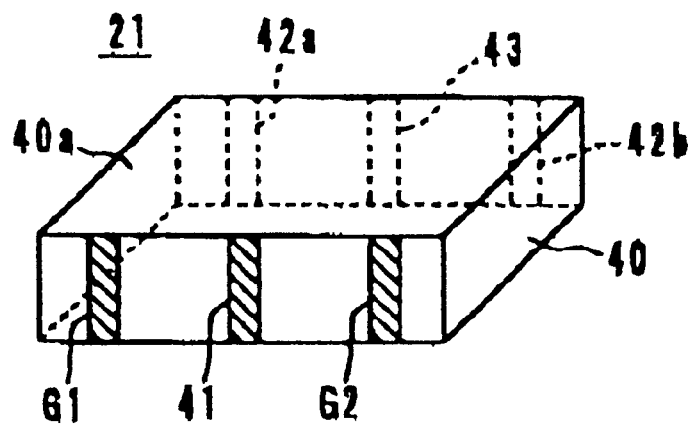
FIG. 2 is a perspective view of the balun transformer according to the first preferred embodiment of the present invention.

The dielectric sheets 22a to 22k are stacked and integrally fired to provide a laminate 40, as shown in FIG. 2. An unbalanced signal terminal 41 and ground terminals G1 and G2 are provided on the proximal side surface of the laminate 40. Balanced signal terminals 42a and 42b and a relay terminal 43 are provided on the distal side surface of the laminate 40. The terminals 41, 42a, 42b, 43, G1, and G2 are formed by sputtering, deposition, coating, or other suitable method, and include Ag—Pd, Ag, Pd, Cu, a Cu alloy, or other suitable material.

Figure 3:
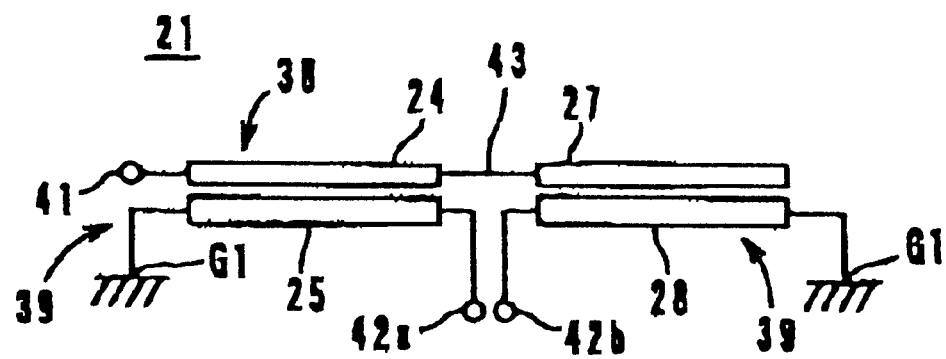
FIG. 3 is an electrical equivalent circuit diagram of the balun transformer according to the first preferred embodiment of the present invention.

The unbalanced signal terminal 41 is electrically connected to the first end 23a of the lead electrode 23, the balanced terminal 42a is electrically connected to the second end 25b of the first line element 25, the balanced signal terminal 42b is electrically connected to the first end 28a of the second line element 28, and the relay terminal 43 is electrically connected to the first end 24a of the third line element 24 and the first end 27a of the fourth line element 27. The ground terminal G1 is electrically connected to the first ends 26a and 29a of the lead electrodes 26 and 29 and the lead portions 30b to 32b of the ground electrodes 30 to 32. The ground electrode G2 is electrically connected to the lead portions 30a to 32b of the ground electrodes 30 to 32. FIG. 3 is an electrical equivalent circuit diagram of the laminated balun transformer 21.

Figure 4:
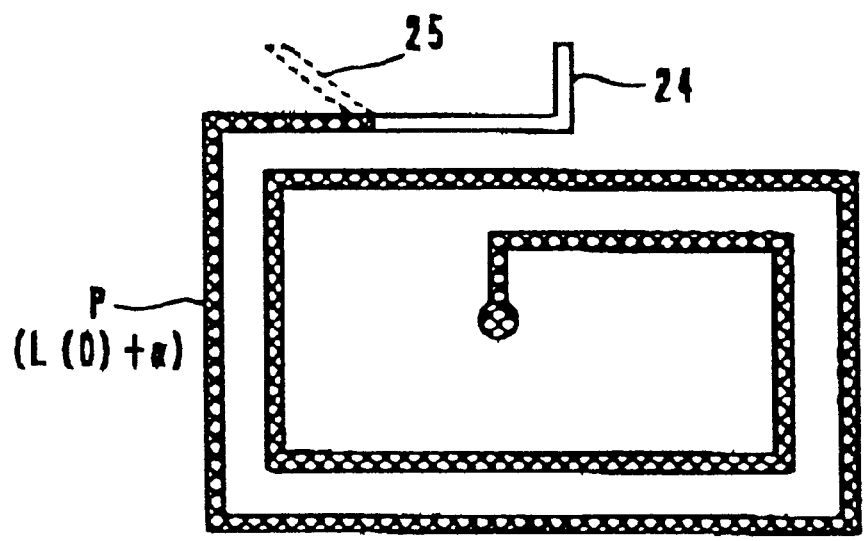
FIG. 4 is a plan view illustrating the positional relationship of two line elements that are electromagnetically coupled, according to the first preferred embodiment of the present invention.
Figure 5:
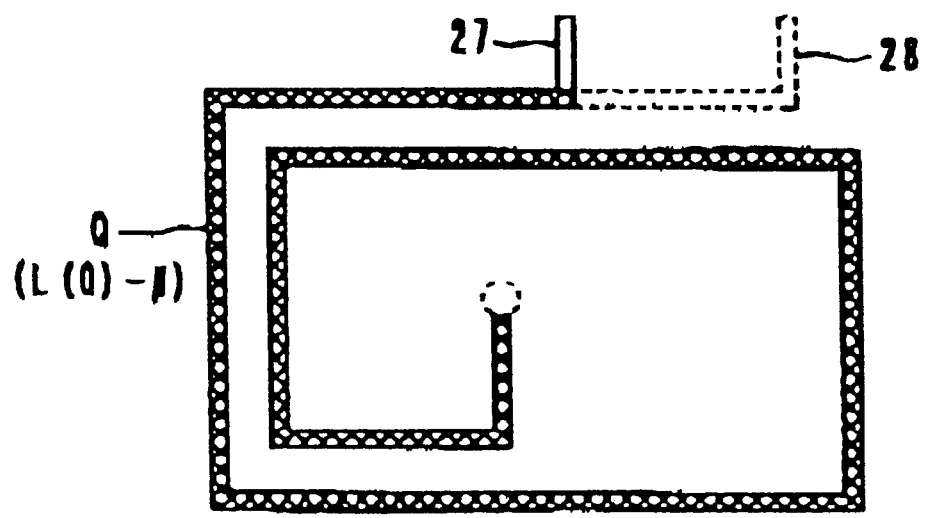
FIG. 5 is a plan view illustrating the positional relationship of two other line elements that are electromagnetically coupled, according to the first preferred embodiment of the present invention.

In the balun transformer 21, the third line element 24 and the first line element 25 are arranged between the ground electrodes 30 and 31, and have a strip line structure. The fourth line element 27 and the second line element 28 are also arranged between the ground electrodes 31 and 32, and have a strip line structure. The third line element 24 and the fourth line element 27 are electrically connected in series through the relay terminal 43, to define an unbalanced transmission line 38. The first line element 25 and the second line element 28 define balanced transmission lines 39, respectively. The line elements 24 and 25 are arranged to oppose each other with the dielectric sheet 22c interposed therebetween, and the line elements 27 and 28 are arranged to oppose each other with the dielectric sheet 22g interposed therebetween. Thus, as shown in FIG. 4, the spiral pattern of the third line element 24 and the spiral pattern of the first line element 25 substantially overlap each other in plan view. In FIG. 4, a coupling portion P of the third line element 24 and the first line element 25 is indicated by cross-hatching. The third line element 24 and the first line element 25 are electromagnetically coupled (line coupling) at the coupling portion P to define a first coupler. Similarly, as shown in FIG. 5, the spiral pattern of the fourth line element 27 and the spiral pattern of the second line element 28 substantially overlap each other in plan view. In FIG. 5, a coupling portion Q of the fourth line element 27 and the second line element 28 is indicated by cross-hatching. The fourth line element 27 and the second line element 28 are electromagnetically coupled (line coupling) at the coupling portion Q to define a second coupler.

Figure 6:
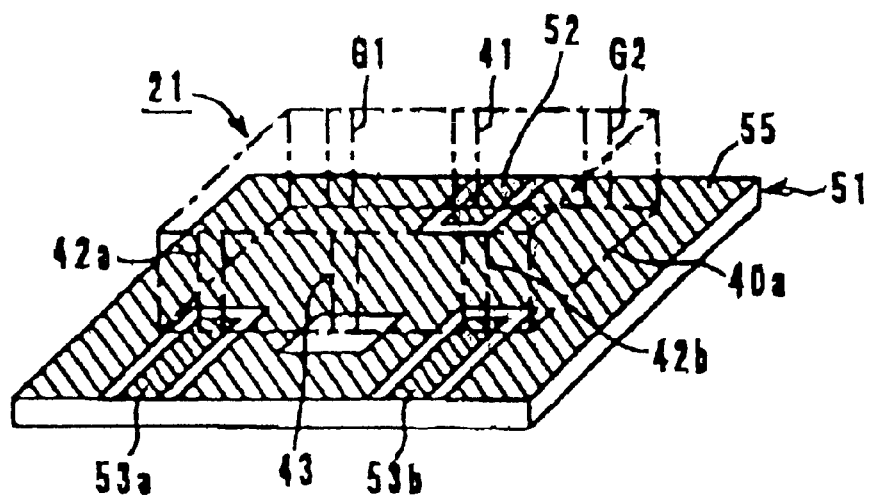
FIG. 6 is a perspective view illustrating the balun transformer, according to the first preferred embodiment of the present invention, mounted on a circuit board.

An upper surface 40a of the laminate 40 shown in FIG. 2 defines a mounting surface when the balun transformer 21 is mounted on a circuit board, that is, the balun transformer 21 shown in FIG. 2 is turned upside down, as shown in FIG. 6, and is soldered to a circuit board 51. The circuit board 51 includes, on the upper surface thereof, an unbalanced signal pattern 52, a pair of balanced signal patterns 53a and 53b, and a large-area ground pattern 55. The unbalanced signal terminal 41 of the balun transformer 21 is connected to the unbalanced signal pattern 52. The balanced signal terminals 42a and 42b are connected to the balanced signal patterns 53a and 53b, respectively. The ground terminals G1 and G2 are connected to the ground pattern 55.

Thus, when the balun transformer 21 is mounted on the circuit board 51, the distance between the second and fourth line elements 28 and 27, which are electromagnetically coupled, and the ground pattern 55 is less than the distance between the first and third line elements 25 and 24, which are electromagnetically coupled, and the ground pattern 55. As a result, the length of an effective conductor path (a portion of the ground electrode G1) that provides an electrical connection between the second line element 28 and the ground pattern 55 is increased. Thus, the parasitic inductance generated in the conductor path is greater than the parasitic inductance generated in an effective conductor path (a portion of the ground electrode G1) that provides an electric connection between the first line element 25 and the ground pattern 55. Accordingly, the length of the coupling portion P of the first and third line elements 25 and 24, from which the distance to the ground pattern 55 is reduced, is greater than the length of the coupling portion Q of the second and fourth line elements 28 and 27.

Meanwhile, when the length of a λ/4 line element at a given characteristic impedance is L(0), configuring the line element in a spiral shape provides substantially the same effect (so-called "reduction effect") using a line element that is shorter than the length L(0). Accordingly, the length of the coupling portion Q of the second and fourth line elements 28 and 27, which are electromagnetically coupled, is preferably about L(0)−β, and the coupling portion P of the third and first line elements 24 and 25, which are electromagnetically coupled, is preferably about L(0)+α, where α and β satisfy the relationships α>0, β>0, and α=β or α≠β. This arrangement provides adjustment of the phase of a balanced signal output from the balanced transmission lines 39 and the phase of an unbalanced signal output from the unbalanced transmission line 38. The length of the coupling portion P is preferably adjusted in the range of about 1.0 to about 1.25 times the length L(0), and the length of the coupling portion Q is preferably adjusted in the range of about 0.75 to about 1.0 times the length L(0).

While one end (specifically, the end 27a of the fourth line element 27) of the unbalanced transmission line 38 is free, it may be connected to the ground. The balun transformer 21 includes a shielding effect, because the ground electrodes 30 and 32 are respectively provided in the upper and lower sections of the balun transformer 21.

The balun transformer 21 used as a balanced-to-unbalanced converter will now be described with reference to FIG. 3. When an unbalanced signal S1 is input to the unbalanced signal terminal 41, the unbalanced signal S1 is transmitted through the unbalanced transmission line 38 (i.e., the lead electrode 23, line element 24, relay terminal 43, and line element 27). The third line element 24 is electromagnetically coupled with the first line element 25 and the fourth line element 27 is electromagnetically coupled with the second line element 28, thereby converting the unbalanced signal S1 into a balanced signal S2. The balanced signal S2 is output from the balanced signal terminals 42a and 42b. Conversely, when a balanced signal S2 is input to the balanced signal terminals 42a and 42b, the balanced signal S2 is transmitted through the balanced transmission lines 39. The balanced signal S2 is converted by the unbalanced transmission line 38 into an unbalanced signal S1, which is then output from the unbalanced signal terminal 41.

Figure 7:
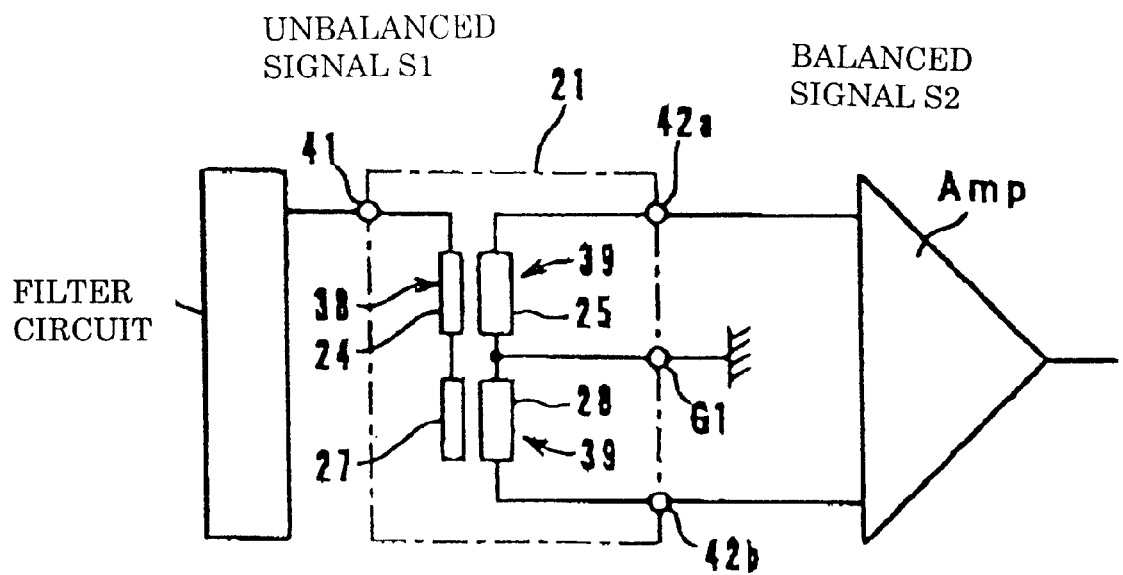
FIG. 7 is a circuit diagram illustrating the main portion of the balun transformer, according to the first preferred embodiment of the present invention, incorporated in mobile communication equipment.

With reference to FIG. 7, a description will now be given of the balun transformer 21 provided in mobile communication equipment, such as a portable telephone, or a wireless LAN to amplify a balanced signal that is transmitted through the balanced transmission lines 39. FIG. 7 is an electrical circuit diagram of the major portion of the balun transformer 21 provided in mobile communication equipment. The balun transformer 21 is connected between a filter circuit and a low-noise amplifier Amp. An unbalanced signal S1 input from the filter circuit is converted by the balun transformer 21 into a balanced signal S2, which is then output from the balanced signal terminals 42a and 42b to the low-noise amplifier Amp.

The unbalanced signal terminal 41, which defines an input terminal, is connected to the third line element 24 that is electromagnetically coupled with the first line element 25. The balanced signal terminals 42a and 42b, which define output terminals, are connected the second line elements 28 and the fourth line elements 27, which are electromagnetically coupled.

The input impedance of the balun transformer 21 is typically about 50 Ω, which is lower than the output impedance (greater than about 50 Ω; typically, about 100 to about 200 Ω) thereof. To provide a low input impedance, the line width of the first and third line elements 25 and 24 is increased relative to the second and fourth line elements 28 and 27, and/or the thicknesses of the dielectric sheets 22a, 22b, 22d, and 22e are reduced so as to reduce the distance from the first and third line elements 25 and 24 to the ground electrodes 30 and 31. With this arrangement, however, the "reduction effect" of the first and third line elements 25 and 24 is decreased.

Accordingly, the length of the coupling portion P of the first and third line elements 25 and 24, which are connected to the unbalanced terminal (input terminal) 41, must be greater than the length of the coupling portion Q of the second and fourth line elements 28 and 27. Thus, in this preferred embodiment, the length of the coupling portion P of the third and first line elements 24 and 25, which are electromagnetically coupled, is preferably about L(0)+α. With this arrangement, in which the length of the coupling portion P of the third and first line elements 24 and 25 is preferably about L(0)+α, setting the length of the coupling portion Q of the second and fourth line elements 28 and 27 greatly improves the design versatility. Additionally, this arrangement does not adversely affect the design and structure, even where it is structurally difficult to design the length of the coupling portion P of the first and third line elements 25 and 24 to be equal to the length of the coupling portion Q of the second and fourth line elements 28 and 27.

Figure 8:
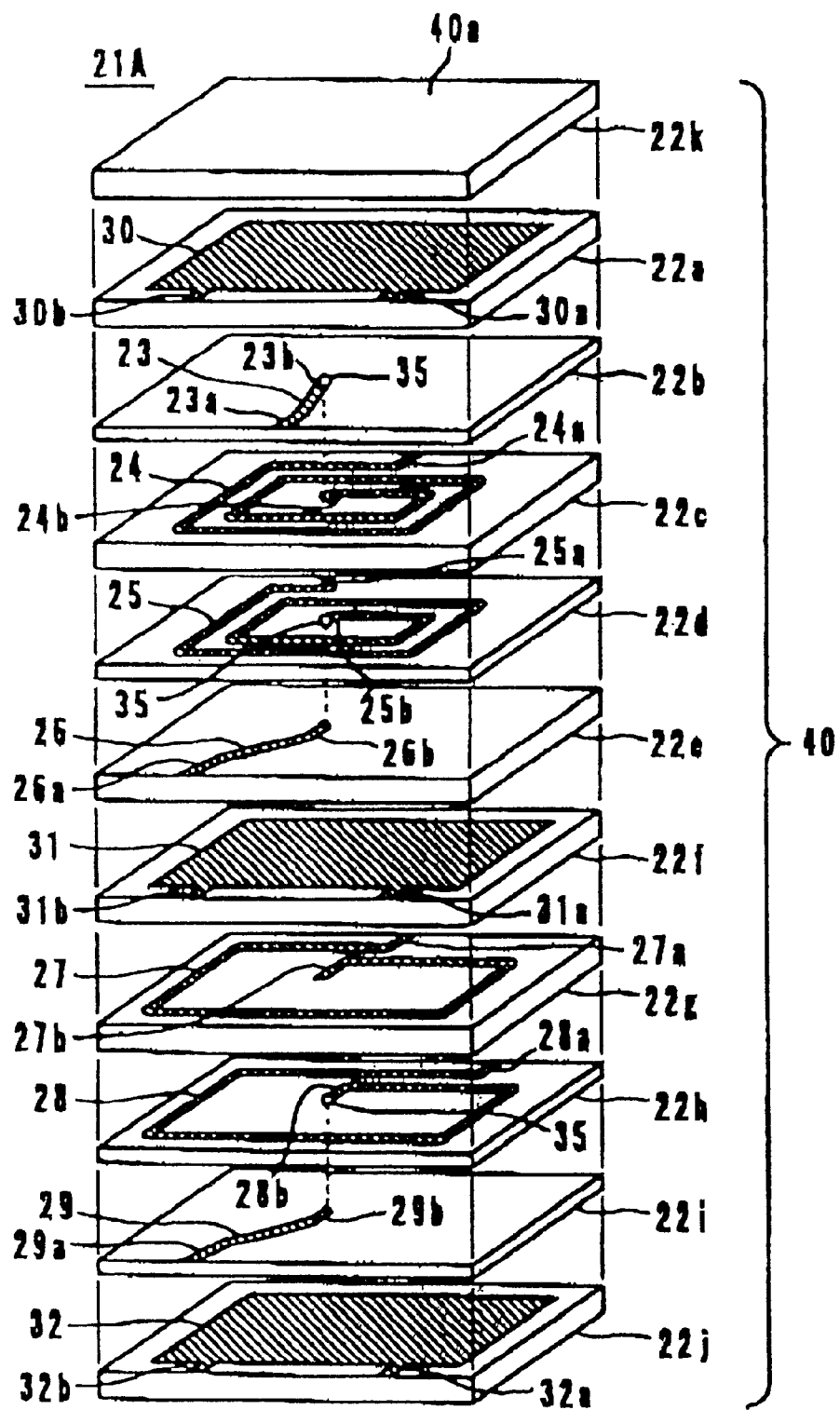
FIG. 8 is an exploded perspective view of a laminated balun transformer according to a second preferred embodiment of the present invention.
Figure 9:
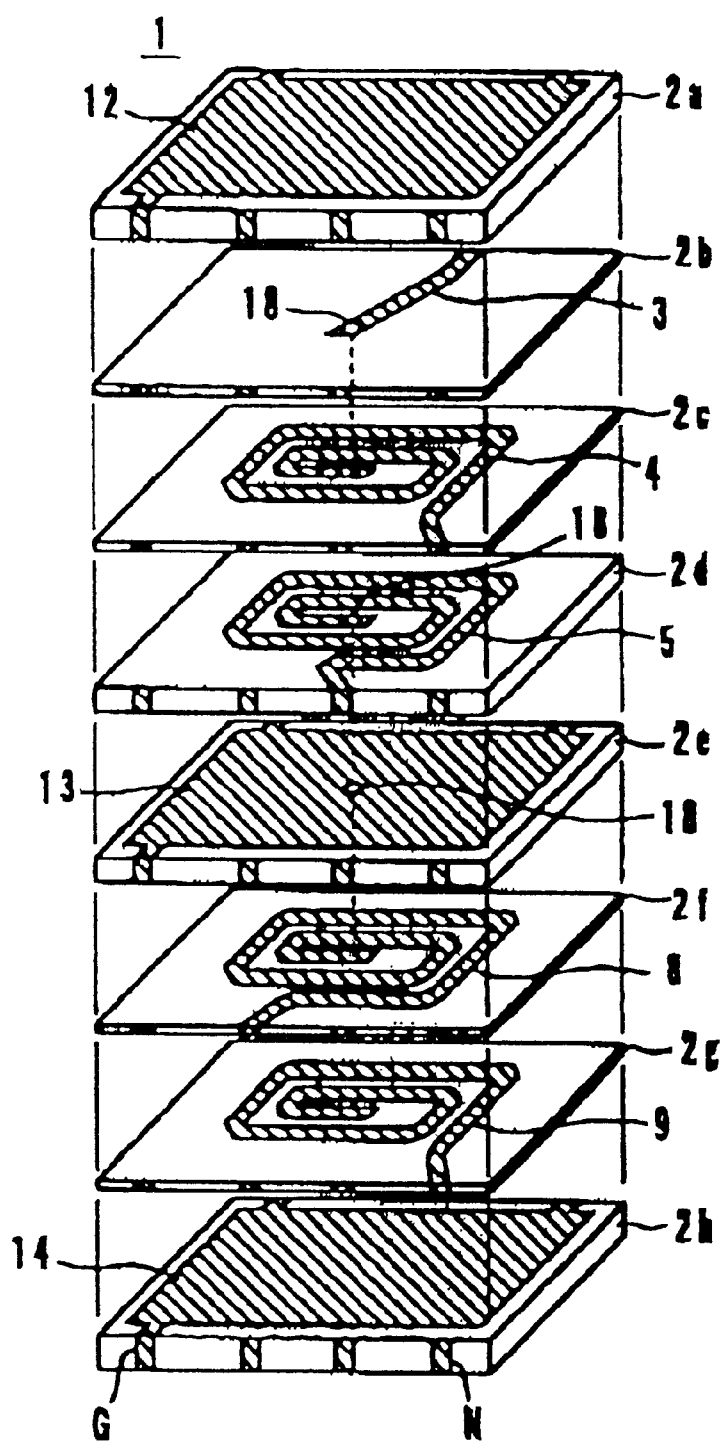
FIG. 9 is an exploded perspective view of a laminated balun transformer of the related art.

A second preferred embodiment of the present invention will now be described with reference to FIG. 8. In a balun transformer 21A of a second preferred embodiment only the number of turns of the coupling portion Q of the fourth and second line elements 27 and 28 is varied without changing the length thereof, and other structures of the balun transformer 21A are substantially the same as the balun transformer 21 of the first preferred embodiment. As shown in FIG. 8, the number of turns of the fourth and second line elements 27 and 28 of the second preferred embodiment, which have a spiral pattern, is about one, and thus is less than the about 1.5 turns of the fourth and second line elements 27 and 28 of the first preferred embodiment. The spiral pattern of the fourth line element 27 and the spiral pattern of the second line element 28 substantially overlap each other in plan view. Electromagnetic coupling (line coupling) occurs at the coupling portion Q, where the patterns of the fourth and second line elements 27 and 28 are overlapped, to define the second coupler. The length of the coupling portion Q of the fourth and second line elements 27 and 28 of the second preferred embodiment, which are electromagnetically coupled, is substantially equal to the length of the coupling portion Q of the fourth and second line elements 27 and 28 of the first preferred embodiment. That is, the length of the coupling portion Q of the second preferred embodiment is about L(0)−β.

As described above, without changing the number of turns of the third and first line elements 24 and 25, varying the number of turns of the fourth and second line elements 27 and 28 adjusts the respective inductance components of the fourth and second line elements 27 and 28. As a result, this arrangement facilitates adjustment of the input impedance of the laminated balun transformer 21A. In addition, this arrangement enables fine adjustment of the phase of a balanced signal output from the balanced transmission lines 39 and the phase of an unbalanced signal output from the unbalanced transmission line 38.

Having described the specific preferred embodiments of the present invention, the laminated balun transformer of the present invention is not limited thereto and thus can be modified within the sprit and scope of the present invention. For example, the shape of the line elements 24, 25, 27, and 28, which have a spiral shape in the preferred embodiments, is arbitrary. Further, all the line elements are not required to have the same line width.

In addition, the structure of the first to fourth line elements 25, 28, 24, and 27 is not limited to the strip line structure disposed between two ground electrodes, and may be a so-called "microstrip line structure" in which line elements are provided on the obverse surface of a dielectric substrate (with a ground electrode provided on the reverse surface).

When the balun transformer 21 is connected as shown in FIG. 7, the first coupler defined by the third and first line elements 24 and 25 and the second coupler defined by the fourth and second line elements 27 and 28 do not necessarily have to be vertically arranged in the laminate in which the dielectric sheets 22a to 22k are laminated. Thus, the couplers may be arranged side by side on a dielectric sheet.

Additionally, the number of couplers defined by electromagnetically-coupled line elements is not limited to two, and thus may be three or more. For example, a so-called "dual balun transformer" having a pair of balanced transmission lines and two unbalanced transmission lines that are electromagnetically coupled with the balanced transmission lines may also be provided. Alternatively, a balun transformer having one unbalanced transmission line and two pairs of balanced transmission lines that are electromagnetically coupled with the unbalanced transmission line may also be provided.

While the preferred embodiments have been described in the context of a single component, with mass production, a motherboard (or motherboards) having a plurality of balun transformers can be manufactured and cut into a plurality of components having a desired size. Further, in the preferred embodiments, after the dielectric sheets on which conductors have been provided are stacked, the dielectric sheets are integrally fired, however, the present invention is not limited thereto, and sheets that have been fired in advance may be used.

In addition, the balun transformer may be fabricated by the following method. Dielectric paste is first applied to a surface of a base material by printing or other suitable method to form a dielectric layer, and conductive paste is applied to a surface of the dielectric layer to form a conductor. Next, dielectric paste is provided on the conductor. Overlaying pastes sequentially in that manner produces a balun transformer having a laminated structure.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A laminated balun transformer to be mounted on a circuit board having a ground pattern, comprising:

a laminate including first and second spiral line elements that define a pair of balanced transmission lines, third and fourth spiral line elements that define an unbalanced transmission line that is electromagnetically coupled with the balanced transmission lines; and a plurality of dielectric layers, wherein the first, second, third, and fourth spiral line elements, and the dielectric layers are laminated together; wherein when the laminated balun transformer is mounted on the circuit board, the distance from the second and fourth line elements, which are electromagnetically coupled, to the ground pattern is greater than the distance from the first and third line elements, which are electromagnetically coupled, to the ground pattern; and when the length of a $\lambda/4$ line element at a given characteristic impedance is $L(0)$, a coupling portion at which the first and third line elements are electromagnetically coupled has a length that is approximately equal to $L(0)+\alpha$ and a coupling portion at which the second and fourth line elements are electromagnetically coupled has a length that is approximately equal to $L(0)-\beta$, where $\alpha>0$ and $\beta>0$.

2. The laminated balun transformer according to claim 1, wherein the number of turns of the first and third spiral line elements, which are electromagnetically coupled, is greater than the number of turns of the second and fourth spiral line elements, which are electromagnetically coupled.

3. The laminated balun transformer according to claim 1, further comprising a lead electrode including a first end that is exposed at an approximate middle of a proximal edge of one of said plurality of dielectric layers, and a second end located at an approximate center of said one of said plurality of dielectric layers.

4. The laminated balun transformer according to claim 3, wherein said third line element includes a first end that is exposed at the approximate middle of a distal edge of another of the plurality of dielectric layers and a second end that is located at an approximate center of said another of said plurality of dielectric layers, wherein said second end of said lead electrode is electrically connected to said second end of said third line element through a via hole provided in said one of said plurality of dielectric layers.

5. The laminated balun transformer according to claim 1, wherein said first line element includes a first end that is exposed at a left side of a distal edge of one of said plurality of dielectric layers and a second end that is located at the approximate center of said one of said plurality of dielectric layers.

6. The laminated balun transformer according to claim 1, wherein the fourth line element includes a first end that is exposed at an approximate middle of a distal edge of one of plurality of dielectric layers and a second end that is located at the approximate center of said one of said plurality of dielectric layers, and the second line element includes a first end that is exposed at a right side of a distal edge of another of said plurality of dielectric layers adjacent to said one of said plurality of dielectric layers and a second end that is located at the approximate center of said another of said plurality of dielectric layers, said second ends of said fourth and second line elements are electrically connected through a via hole provided in one of the one and another of said plurality of dielectric layers.

7. The laminated balun transformer according to claim 1, further comprising ground electrodes provided on respective ones of said plurality of dielectric layers.

8. The laminated balun transformer according to claim 7, wherein said ground electrodes are provided on substantially an entire surface of the respective dielectric layers.

9. The laminated balun transformer according to claim 7, wherein said first and third line elements are arranged between two of said ground electrodes.

10. The laminated balun transformer according to claim 7, wherein said second and fourth line elements are arranged between two of said ground electrodes.

11. A laminated balun transformer having an input impedance less than the output impedance thereof, comprising:

a laminate including first and second spiral line elements that define a pair of balanced transmission lines, third and fourth spiral line elements that define an unbalanced transmission line that is electromagnetically coupled with the balanced transmission lines; and a plurality of dielectric layers, wherein the first, second, third, and fourth spiral line elements, and the dielectric layers are laminated together; wherein the third line element, which is electromagnetically coupled with the first line element, is connected to an input terminal of the laminated balun transformer, and the second and fourth line elements, which are electromagnetically coupled, are connected to two output terminals, respectively, and wherein, when the length of a $\lambda/4$ line element at a given characteristic impedance is $L(0)$, a coupling portion at which the first and third line elements are electromagnetically coupled has a length that is approximately equal to $L(0)+\alpha$ and a coupling portion at which the second and fourth line elements are electromagnetically coupled has a length that is approximately equal to $L(0)-\beta$, where $\alpha>0$ and $\beta>0$.

12. The laminated balun transformer according to claim 11, wherein the number of turns of the first and third spiral line elements, which are electromagnetically coupled, is greater than the number of turns of the second and fourth spiral line elements, which are electromagnetically coupled.

13. The laminated balun transformer according to claim 11, further comprising a lead electrode including a first end that is exposed at an approximate middle of a proximal edge of one of said plurality of dielectric layers, and a second end located at an approximate center of said one of said plurality of dielectric layers.

14. The laminated balun transformer according to claim 13, wherein said third line element includes a first end that is exposed at the approximate middle of a distal edge of another of the plurality of dielectric layers and a second end that is located at an approximate center of said another of said plurality of dielectric layers, wherein said second end of said lead electrode is electrically connected to said second end of said third line element through a via hole provided in said one of said plurality of dielectric layers.

15. The laminated balun transformer according to claim 11, wherein said first line element includes a first end that is exposed at a left side of a distal edge of one of said plurality of dielectric layers and a second end that is located at the approximate center of said one of said plurality of dielectric layers.

16. The laminated balun transformer according to claim 11, wherein the fourth line element includes a first end that is exposed at an approximate middle of a distal edge of one of plurality of dielectric layers and a second end that is located at the approximate center of said one of said plurality of dielectric layers, and the second line element includes a first end that is exposed at a right side of a distal edge of another of said plurality of dielectric layers adjacent to said one of said plurality of dielectric layers and a second end that is located at the approximate center of said another of said plurality of dielectric layers, said second ends of said fourth and second line elements are electrically connected through a via hole provided in one of the one and another of said plurality of dielectric layers.

17. The laminated balun transformer according to claim 11, further comprising ground electrodes provided on respective ones of said plurality of dielectric layers.

18. The laminated balun transformer according to claim 17, wherein said ground electrodes are provided on substantially an entire surface of the respective dielectric layers.

19. The laminated balun transformer according to claim 17, wherein said first and third line elements are arranged between two of said ground electrodes.

20. The laminated balun transformer according to claim 17, wherein said second and fourth line elements are arranged between two of said ground electrodes.

* * * * *